United States Patent
Qiang et al.

(10) Patent No.: US 9,887,449 B2
(45) Date of Patent: Feb. 6, 2018

(54) RADIO FREQUENCY COUPLING STRUCTURE AND A METHOD OF MANUFACTURING THEREOF

(71) Applicants: Li Qiang, Gilbert, AZ (US); Olin Lee Hartin, Scottsdale, AZ (US); Ralf Reuter, Munich (DE); Ziqiang Tong, Munich (DE)

(72) Inventors: Li Qiang, Gilbert, AZ (US); Olin Lee Hartin, Scottsdale, AZ (US); Ralf Reuter, Munich (DE); Ziqiang Tong, Munich (DE)

(73) Assignee: NXP USA, Inc., Austin, TX (US)

( * ) Notice: Subject to any disclaimer, the term of this patent is extended or adjusted under 35 U.S.C. 154(b) by 734 days.

(21) Appl. No.: 14/473,038

(22) Filed: Aug. 29, 2014

(65) Prior Publication Data
US 2016/0064792 A1    Mar. 3, 2016

(51) Int. Cl.
*H01P 11/00* (2006.01)
*G01S 7/03* (2006.01)
(Continued)

(52) U.S. Cl.
CPC .............. *H01P 11/003* (2013.01); *G01S 7/03* (2013.01); *G01S 13/02* (2013.01); *H01P 5/024* (2013.01);
(Continued)

(58) Field of Classification Search
CPC .............. H01L 21/00; H01L 21/02019; H01L 21/02697; H01L 21/203; H01L 21/70;
(Continued)

(56) References Cited

U.S. PATENT DOCUMENTS 2,897,409 A * 7/1959 Gitto ...................... H05K 1/095
                                                    174/257
3,417,393 A * 12/1968 Cooke ..................... H01L 21/00
                                                    257/599
(Continued)

FOREIGN PATENT DOCUMENTS

EP     1367668 A1    12/2003
EP     1923950 A1     5/2008
(Continued)

OTHER PUBLICATIONS

Trotta, S. et al., "An RCP Packaged Transceiver Chipset for Automotive LRR and SRR Systems in SiGe BiCMOS Technology," IEEE Transactions on Microwave Theory and Techniques, vol. 60, No. 3, Mar. 2012, pp. 778-794.
(Continued)

*Primary Examiner* — Peter M Bythrow
(74) *Attorney, Agent, or Firm* — Charlene R. Jacobsen

(57) ABSTRACT

A radio frequency transmission structure couples a RF signal between a first and a second radiating elements arranged at a first and a second sides of a first dielectric substrate, respectively. The RF coupling structure comprises: a hole arranged through the first dielectric substrate, a first electrically conductive layer arranged on a first wall of the hole to electrically connect a first and a second signal terminals, a second electrically conductive layer arranged on a second wall of the hole opposite to the first wall to electrically connect a first and a second reference terminals. The first electrically conductive layer is separated from the second electrically conductive layer. The hole extends beyond the first wall away from the second wall.

20 Claims, 12 Drawing Sheets

(51) Int. Cl.
*G01S 13/02* (2006.01)
*H01P 5/02* (2006.01)
*H05K 1/02* (2006.01)
*H01P 3/12* (2006.01)
*G01S 13/93* (2006.01)
*H05K 1/14* (2006.01)

(52) U.S. Cl.
CPC .......... *H05K 1/0274* (2013.01); *G01S 13/931* (2013.01); *H01P 3/121* (2013.01); *H05K 1/0243* (2013.01); *H05K 1/144* (2013.01); *H05K 2201/0187* (2013.01); *H05K 2201/041* (2013.01); *H05K 2201/09854* (2013.01); *H05K 2201/09981* (2013.01)

(58) Field of Classification Search
CPC ......... H01L 21/76802; H01L 21/76816; H01L 21/76838; H01P 3/121; H01P 5/024; H05P 11/002; H05P 11/003; H05K 1/0298; H05K 1/11; H05K 1/112; H05K 1/115; H05K 1/144; H05K 3/00
USPC ....................................... 342/175
See application file for complete search history.

(56) References Cited

U.S. PATENT DOCUMENTS

| | | | | |
|---|---|---|---|---|
| 4,737,395 A * | 4/1988 | Mabuchi | ................ | H01L 23/13 174/255 |
| 4,775,611 A * | 10/1988 | Sullivan | ................ | H05K 3/045 174/250 |
| 4,861,640 A * | 8/1989 | Gurol | ................ | H05K 3/045 174/250 |
| 5,374,788 A * | 12/1994 | Endoh | ................ | H05K 1/056 174/255 |
| 5,490,965 A * | 2/1996 | Christiansen | ......... | C04B 35/653 264/234 |
| 5,619,791 A * | 4/1997 | Lambrecht, Jr. | .... | H01F 17/0033 174/266 |
| 6,081,241 A * | 6/2000 | Josefsson | ................ | H01P 5/107 333/26 |
| 6,083,340 A * | 7/2000 | Nomura | ............... | H05K 3/4069 156/253 |
| 6,207,221 B1 * | 3/2001 | Schulz-Harder | .... | H01L 21/4839 101/129 |
| 6,563,712 B2 | 5/2003 | Akram et al. | | |
| 6,686,649 B1 | 2/2004 | Mathews et al. | | |
| 6,713,685 B1 * | 3/2004 | Cotton | ................ | H05K 1/0218 174/262 |
| 6,740,576 B1 * | 5/2004 | Lin | ................ | H01L 23/5389 257/E21.508 |
| 6,910,266 B2 * | 6/2005 | Lee | ................ | H05K 1/162 29/825 |
| 6,982,674 B2 | 1/2006 | Matsubara et al. | | |
| 7,126,541 B2 | 10/2006 | Mohamadi | | |
| 7,126,542 B2 | 10/2006 | Mohamadi | | |
| 7,129,567 B2 * | 10/2006 | Kirby | ................ | B82Y 10/00 257/621 |
| 7,151,228 B2 * | 12/2006 | Takase | ................ | H05K 3/462 174/255 |
| 7,164,898 B2 | 1/2007 | Hankui | | |
| 7,239,526 B1 | 7/2007 | Bibee | | |
| 7,326,858 B2 | 2/2008 | Lee | | |
| 7,394,027 B2 | 7/2008 | Kaluzni et al. | | |
| 7,435,911 B2 * | 10/2008 | Kim | ................ | H05K 1/162 174/260 |
| 7,468,894 B2 | 12/2008 | Bibee | | |
| 7,728,774 B2 | 6/2010 | Akkermans et al. | | |
| 7,755,174 B2 | 7/2010 | Rollin | | |
| 7,767,913 B2 * | 8/2010 | Corisis | ................ | H01L 23/66 174/260 |
| 7,808,439 B2 | 10/2010 | Yang et al. | | |
| 7,868,257 B2 * | 1/2011 | Kushta | ................ | H05K 1/0222 174/262 |
| 7,886,421 B2 | 2/2011 | Hwan et al. | | |
| 7,999,753 B2 | 8/2011 | Gaucher et al. | | |
| 8,013,257 B2 * | 9/2011 | Furuya | ................ | H01G 4/224 174/260 |
| 8,031,474 B2 * | 10/2011 | Ogawa | ................ | G02B 6/138 361/758 |
| 8,169,060 B2 | 5/2012 | Maurer et al. | | |
| 8,199,060 B2 | 6/2012 | Rofougaran et al. | | |
| 8,242,384 B2 * | 8/2012 | Cases | ................ | H05K 1/0242 174/250 |
| 8,283,764 B2 | 10/2012 | Tang | | |
| 8,305,280 B2 | 11/2012 | Brown et al. | | |
| 8,460,967 B2 | 6/2013 | Lachner et al. | | |
| 8,497,804 B2 | 6/2013 | Haubrich | | |
| 8,497,840 B2 | 7/2013 | Zahnert et al. | | |
| 8,633,858 B2 | 1/2014 | Nair et al. | | |
| 8,860,532 B2 | 10/2014 | Gong et al. | | |
| 9,444,135 B2 | 9/2016 | Tong et al. | | |
| 9,615,447 B2 * | 4/2017 | Hurwitz | ................ | H05K 1/0271 |
| 2002/0191380 A1 * | 12/2002 | Val | ................ | H05K 1/185 361/760 |
| 2003/0080836 A1 * | 5/2003 | Nagaishi | ................ | H01L 23/552 333/247 |
| 2003/0100197 A1 * | 5/2003 | Veitschegger | ....... | H05K 1/0204 439/55 |
| 2003/0141348 A1 * | 7/2003 | Tsay | ................ | B23K 31/02 228/180.21 |
| 2004/0118600 A1 * | 6/2004 | Lee | ................ | H05K 1/162 174/260 |
| 2005/0000816 A1 * | 1/2005 | Lin | ................ | B81C 1/0015 205/78 |
| 2005/0069277 A1 * | 3/2005 | Nakazawa | ............. | G01S 7/032 385/147 |
| 2005/0224989 A1 * | 10/2005 | Myers | ................ | H01L 21/486 257/774 |
| 2006/0097906 A1 * | 5/2006 | Heide | ................ | G01S 7/032 342/22 |
| 2006/0131729 A1 * | 6/2006 | Lee | ................ | H01L 21/4803 257/700 |
| 2006/0144617 A1 * | 7/2006 | Kim | ................ | H05K 1/162 174/260 |
| 2006/0204652 A1 * | 9/2006 | Meier | ................ | H05K 3/4053 427/97.7 |
| 2007/0013581 A1 * | 1/2007 | Iijima | ................ | G01S 7/032 342/175 |
| 2007/0017697 A1 * | 1/2007 | Hsu | ................ | H05K 1/115 174/255 |
| 2007/0080864 A1 | 4/2007 | Channabasappa | | |
| 2007/0211403 A1 * | 9/2007 | Sievenpiper | ........... | H05K 1/162 361/301.1 |
| 2007/0221405 A1 * | 9/2007 | Cheng | ................ | H05K 1/0219 174/265 |
| 2008/0007927 A1 * | 1/2008 | Ito | ................ | H01L 23/49822 361/764 |
| 2008/0042248 A1 * | 2/2008 | Nalla | ................ | H01L 21/4853 257/678 |
| 2008/0060194 A1 * | 3/2008 | Liao | ................ | H05K 1/162 29/852 |
| 2008/0079118 A1 * | 4/2008 | Bang | ................ | H05K 1/0231 257/532 |
| 2008/0180878 A1 * | 7/2008 | Wang | ................ | H01G 4/228 361/306.3 |
| 2008/0197469 A1 | 8/2008 | Yang et al. | | |
| 2008/0272964 A1 | 11/2008 | Su et al. | | |
| 2008/0297283 A1 * | 12/2008 | Byun | ................ | H01P 5/107 333/21 R |
| 2009/0015485 A1 * | 1/2009 | Floyd | ................ | H01Q 9/0457 343/700 MS |
| 2009/0057912 A1 * | 3/2009 | Kheng | ................ | H05K 3/4602 257/774 |
| 2010/0193935 A1 | 8/2010 | Lachner | | |
| 2010/0206617 A1 * | 8/2010 | Johnson | ................ | H05K 1/0221 174/251 |

(56) References Cited

U.S. PATENT DOCUMENTS

| | | | | |
|---|---|---|---|---|
| 2010/0245155 | A1* | 9/2010 | Miyazato | G01S 7/032 342/104 |
| 2011/0057743 | A1* | 3/2011 | Shimura | H01P 5/024 333/26 |
| 2011/0234472 | A1 | 9/2011 | Maurer et al. | |
| 2012/0013499 | A1* | 1/2012 | Hayata | G01S 7/032 342/112 |
| 2012/0086114 | A1 | 4/2012 | Zaho et al. | |
| 2012/0104574 | A1* | 5/2012 | Boeck | H01L 23/49816 257/660 |
| 2012/0111726 | A1* | 5/2012 | Couto Petri | G01N 27/4075 204/424 |
| 2012/0119969 | A1 | 5/2012 | MacDonald et al. | |
| 2012/0128291 | A1 | 5/2012 | Teitelbaum et al. | |
| 2012/0182066 | A1* | 7/2012 | Merkle | H05K 1/0243 327/564 |
| 2012/0188138 | A1 | 7/2012 | Liu | |
| 2012/0256795 | A1* | 10/2012 | Tajima | G01S 7/032 343/700 MS |
| 2012/0274419 | A1 | 11/2012 | Lee et al. | |
| 2013/0012145 | A1* | 1/2013 | Shibuya | H01P 3/12 455/90.3 |
| 2013/0050016 | A1* | 2/2013 | Kim | H01Q 19/30 342/195 |
| 2013/0074332 | A1* | 3/2013 | Suzuki | H05K 1/185 29/834 |
| 2013/0171752 | A1* | 7/2013 | Val | H01L 22/14 438/15 |
| 2013/0207274 | A1 | 8/2013 | Liu et al. | |
| 2013/0256850 | A1* | 10/2013 | Danny | H01L 23/66 257/664 |
| 2014/0262448 | A1* | 9/2014 | Kato | H05K 1/0253 174/251 |
| 2014/0300521 | A1 | 10/2014 | Junemann | |
| 2015/0181693 | A1* | 6/2015 | Wu | H05K 1/115 174/262 |
| 2015/0346322 | A1* | 12/2015 | Schmalenberg | G01S 7/02 342/175 |
| 2015/0364829 | A1* | 12/2015 | Tong | H01Q 19/10 342/175 |
| 2015/0364830 | A1* | 12/2015 | Tong | H01Q 19/10 342/27 |
| 2015/0382469 | A1* | 12/2015 | Hu | H01L 23/49827 361/761 |

FOREIGN PATENT DOCUMENTS

| | | |
|---|---|---|
| EP | 2500978 B1 | 7/2013 |
| WO | 2012140422 A2 | 10/2012 |

OTHER PUBLICATIONS

Deslandes, Dominic, "Design Equations for Tapered Microstrip-to-Substrate Integrated Waveguide Transitions," 2010 IEEE MTT-S International Microwave Symposium Digest (MTT); May 23-28, 2019, pp. 704-707.

Glogowski, R. et al., "Double Resonance Transition from Rectangular Waveguide to Substrate Integrated Waveguide," 2013 IEEE 7th European Conference on Antennas and Propagation (EuCAP); Apr. 8-12, 2013; pp. 3353-3354.

Henawy, M.A., et al., "Integrated Antennas in eWLB Packages for 77 GHz and 79 GHz Automotive Radar Sensors," Proceedings of the 8th European Radar Conference; Oct. 12-14, 2011, Manchester, UK; pp. 424-427.

Keser, B. et al., "The Redistributed Chip Package: A Breakthrough for Advanced Packaging," Proceedings of the 57th IEEE Electronic Components and Technology Conference, 2007; May 29, 2007-Jun. 1, 2007; pp. 286-291.

Lamy, Y. et al., "mmW Characterization of Wafer Level Passivation for 3D Silicon Interposer," 2013 IEEE 63rd Electronic Components & Technology Conference; May 28-31, 2013; pp. 1187-1981.

Pohl, N. et al., "An UWB 80GHz FMCW Radar System Using a SiGe Bipolar Transceiver Chip Stabilized by a Fractional-N PII Synthesizer," IEEE Transactions on Microwave Theory and Techniques, vol. 60, No. 3, Mar. 2012, pp. 757-765.

Schmid, C.M. et al., "A 77-GHz FMCW Radar Transceiver MMIC/Waveguide Integration Approach," 2013 IEEE MTT-S International Microwave Symposium Digest (IMS); Jun. 2-7, 2013; pp. 1-4.

U.S. Appl. No. 14/303,707, filed Jun. 13, 2014, entitled "Integrated Circuit Package with Radio Frequency Coupling Arrangement".

U.S. Appl. No. 14/303,705, filed Jun. 13, 2014, entitled "Radio Frequency Coupling Structure".

U.S. Appl. No. 14/303,713, filed Jun. 13, 2014, entitled "Integrated Circuit Package with Radio Frequency Coupling Structure".

Final Office Action dated Jun. 23, 2016 for U.S. Appl. No. 14/303,705.

Non-Final Office Action dated Feb. 17, 2016 for U.S. Appl. No. 14/303,707, 14 pages.

Non-Final Office Action dated Oct. 6, 2016 for U.S. Appl. No. 14/303,707, 12 pages.

Non-Final Office Action dated Oct. 6, 2016 for U.S. Appl. No. 14/303,713.

Notice of Allowance dated May 26, 2016 for U.S. Appl. No. 14/490,849 12 pages.

Fischer, A. et al., "A 77-GHz antenna and fully integrated radar transceiver in package," International Journal of Microwave and Wireless Technologies 2012; vol. 4, issue 4; Aug. 2012; 7 pages.

Fischer, A. et al., "A 77-GHz Antenna in Package," 2011 IEEE 41st European Microwave Conference, Oct. 10-13, 2011; pp. 1316-1319.

Wojnowski, M. et al., "A 77-GHz SiGe Single-Chip Four-Channel Transceiver Module with Integrated Antennas in Embedded Wafer-Level BGA Package," IEEE 62nd Electronic Components and Technology Conference; May 29, 2012-Jun. 1, 2012; pp. 1027-1032.

Yang, F. et al., "Microstrip Antenna Integrated With Electromagnetic Band-Gap (EBG) Structures: A Low Mutual Coupling Design for Array Applications," IEEE Transaction on Antennas and Propagation, vol. 51, N. 10; Oct. 2003; pp. 2936-2946.

U.S. Appl. No. 14/490,849, filed Sep. 19, 2014, entitled "Integrated Circuit Package".

Notice of Allowance dated Aug. 31, 2016 for U.S. Appl. No. 14/303,705, 8 pages.

Final Office Action dated Apr. 26, 2017 for U.S. Appl. No. 14/303,713, 17 pages.

Notice of Allowance dated Dec. 21, 2016 for U.S. Appl. No. 14/303,705, 13 pages.

Alleaume, PF. et al., "Millimeter-wave SMT Low Cost Plastic Packages for Automotive Radar at 77GHz and High Data Rate E-band Radios," IEEE MTT_S International Microwave Symposium Digest, 2009; Jun. 7-12, 2009; pp. 789-792.

Do-Hoon, K. et al., "A Wideband Vertical Transition Between Co-Planar Waveguide and Parallel-Strip Transmission," IEEE Microwave and Wireless Components Letters, vol. 15, No. 9, Sep. 2005, pp. 591-593.

Non-Final Office Action dated Feb. 16, 2016 for U.S. Appl. No. 14/303,713, 15 pages.

Non-Final Office Action dated Feb. 16, 2016 for U.S. Appl. No. 14/490,849, 7 pages.

Non-Final Office Action dated Feb. 17, 2016 for U.S. Appl. No. 14/303,707, 15 pages.

Non-Final Office Action dated Jan. 14, 2016 for U.S. Appl. No. 14/303,705, 7 pages.

* cited by examiner

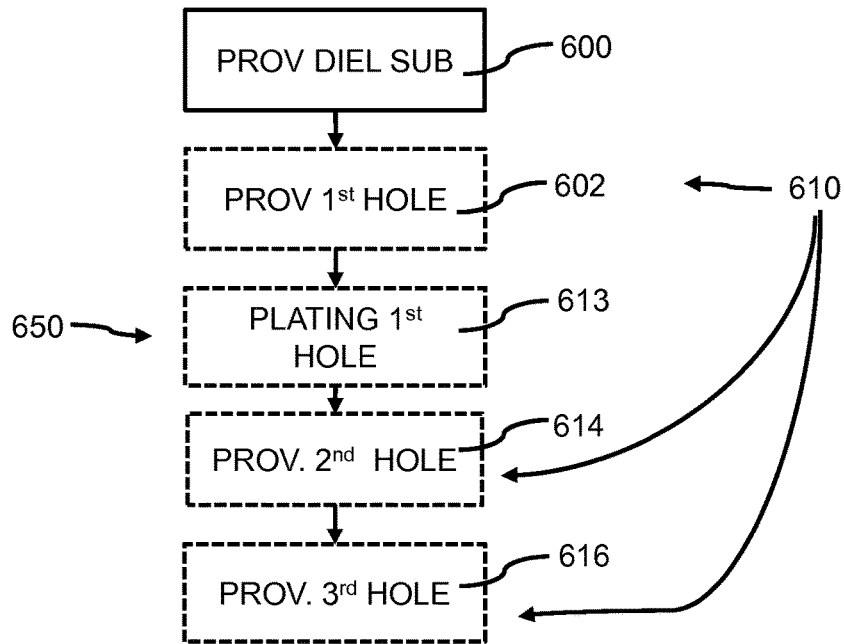
*FIG. 10*
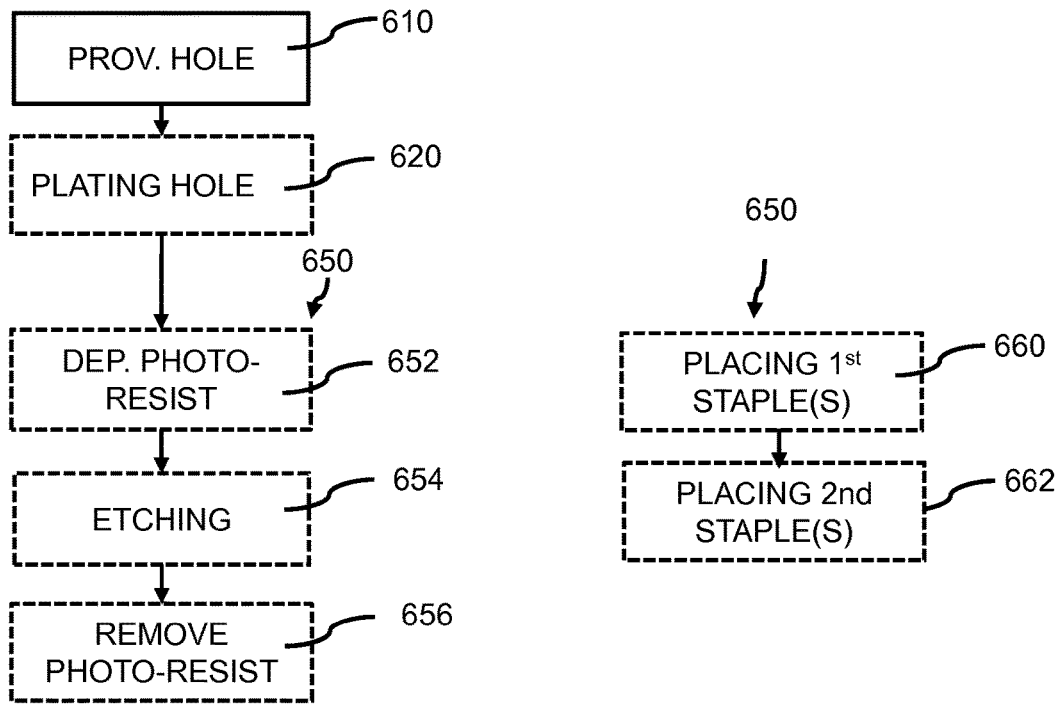
*FIG. 11*　　　　　　　*FIG. 12*

RADIO FREQUENCY COUPLING STRUCTURE AND A METHOD OF MANUFACTURING THEREOF

FIELD OF THE INVENTION

This invention relates to a radio frequency coupling structure, a printed circuit board, a radio frequency device, a radar sensor and to a method of manufacturing the radio frequency coupling structure.

BACKGROUND OF THE INVENTION

Radio frequency (RF) coupling structures may be used to couple a RF signal from one side to another side of a RF device. The RF signal may for example be transmitted from a first radiating element to a second radiating element via the RF coupling structure. Alternatively, in a reciprocal path, the RF signal may be received by the second radiating element and transmitted via the RF structure to the first radiating element. The first radiating element and the second radiating element may be for example an antenna, a waveguide, a transmission line coupled to the RF coupling structure. The RF signal may be attenuated during the transfer from the first radiating element to the second radiating element in a way such that the RF signal may not be transmittable with sufficient strength. RF coupling structures may limit attenuations of the RF signal by matching at radio frequencies the first radiating element with the second radiating element.

Techniques are described in literature to enhance radio frequency coupling between a first radiating element and a second radiating element.

An example of such techniques is disclosed in U.S. Pat. No. 8,169,060 B2. U.S. Pat. No. 8,169,060 B2 discloses an integrated circuit package assembly. The integrated circuit package assembly includes an integrated circuit package and a printed circuit board substrate. The printed circuit board substrate includes a waveguide. The integrated circuit package houses a first antenna that is configured to radiate a first electromagnetic signal. The waveguide generates a waveguide signal based on the first electromagnetic signal, and passes the waveguide signal to a second antenna that is electrically coupled to the waveguide. The second antenna is configured to radiate a second electromagnetic signal received from the waveguide. A conductive layer is formed over an external surface on the integrated circuit package, extends over a top dielectric layer of the integrated circuit package and reflects power radiated from the first antenna towards the waveguide.

SUMMARY OF THE INVENTION

The present invention provides a radio frequency coupling structure, a printed circuit board, a radio frequency device, a radar sensor and a method of manufacturing a radio frequency coupling structure as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale. In the Figures, elements which correspond to elements already described may have the same reference numerals.

FIG. 2 shows a planar view of the example shown in FIG. 1.

FIG. 10 schematically shows a flow diagram of an example of a method of manufacturing a radio frequency coupling structure.

FIG. 11 schematically shows a flow diagram of an example of a method of manufacturing a radio frequency coupling structure.

FIG. 12 schematically shows a flow diagram of an example of a method of manufacturing a radio frequency coupling structure.

DETAILED DESCRIPTION OF THE PREFERRED EMBODIMENTS

An example of a radio frequency (RF) transmission structure 10 will be hereinafter described with reference to FIG. 1 and FIG. 2.

Figure 1:
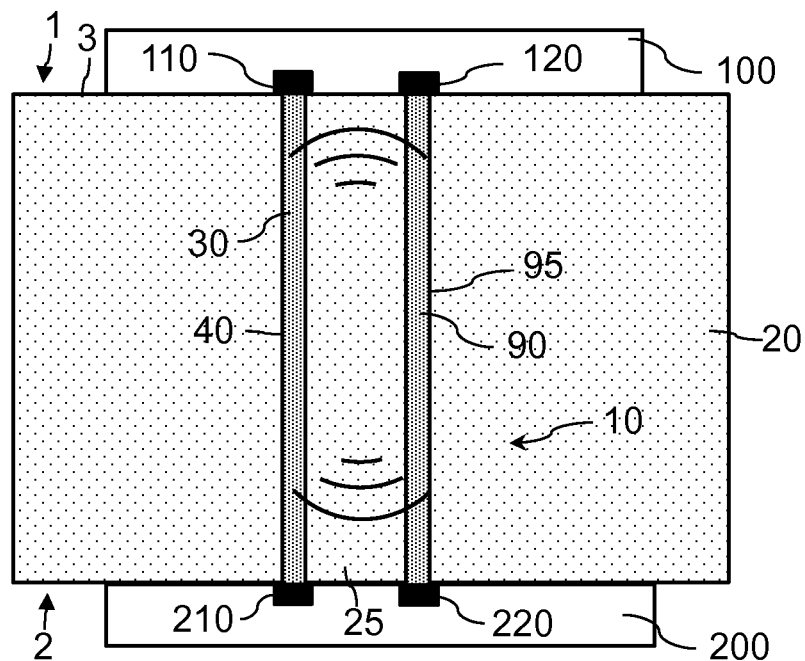
FIG. 1 shows a cross section of an example of an embodiment of a radio frequency coupling structure taken along the line I-I.
Figure 2:
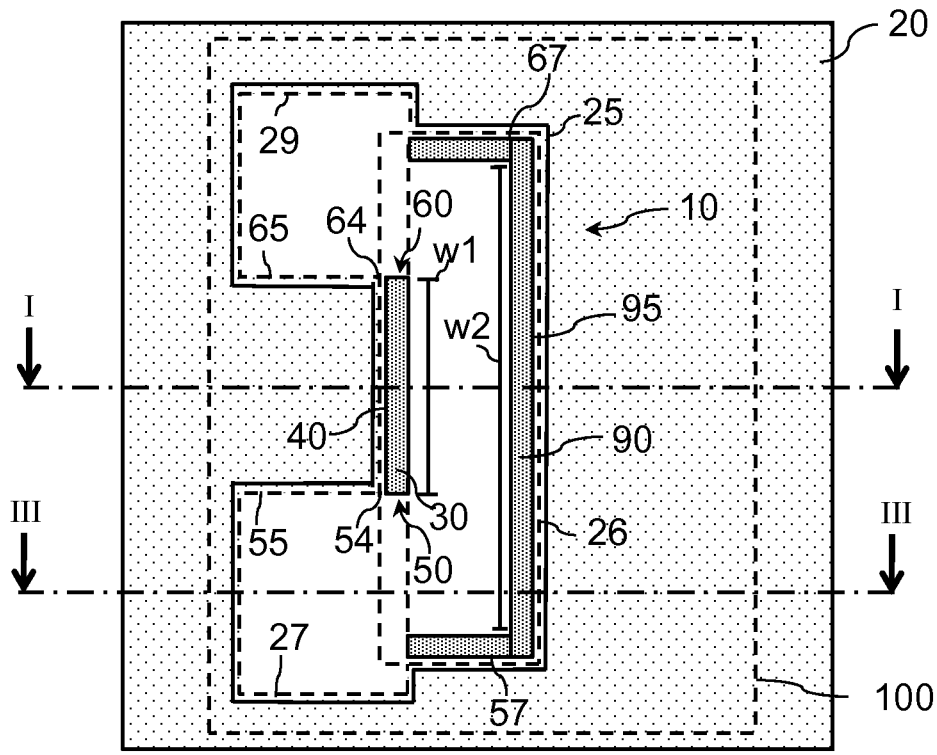
in FIG. 2.

FIG. 1 shows a cross section of the RF coupling structure 10 taken along the line I-I in FIG. 2.

FIG. 2 shows a cross section of the RF coupling structure 10 along a plane parallel to a surface 3 of FIG. 1.

With reference to FIG. 1, the RF coupling structure 10 couples a RF signal between a first radiating element 100 and a second radiating element 200. The first radiating element 100 is arranged at a first side 1 of a first dielectric substrate 20. The second radiating element 200 is arranged at a second side 2 of the first dielectric substrate 20. The second side 2 is opposite to the first side 1. The RF coupling structure 10 comprises a hole 25 arranged through the first dielectric substrate 20 and extending from the first side 1 to the second side 2. The hole 25 is provided in the first dielectric substrate 20. The RF coupling structure 10 comprises a first electrically conductive layer 30 arranged on a first wall 40 of the hole 25 and a second electrically conductive layer 90 arranged on a second wall 95 of the hole 25. The second wall 95 is opposite to the first wall 40. The first electrically conductive layer 30 is arranged to electrically connect a first signal terminal 110 of the first radiating element 100 to a second signal terminal 210 of the second radiating element 200. The second electrically conductive layer 90 is arranged to electrically connect a first reference terminal 120 of the first radiating element 100 to a second reference terminal 220 of the second radiating element 200. The first electrically conductive layer 30 is separated from the second electrically conductive layer 90 in the hole 25. The hole 25 extends beyond the first wall 40 away from the second wall 95. In other words, the hole 25 extends in a plane parallel to a surface 3 of the first dielectric substrate 20 on both sides of the first electrically conductive layer 30 beyond the first wall 40 away from the second wall 95.

With reference to FIG. 2, the hole 25 may for example comprise a first part 26, a second part 27 and a third part 29. In FIG. 2, the first part 26, the second part 27 and the third part 29 are indicated with dashed lines. The first electrically conductive layer 30 may be arranged on a first wall 40 of the first part 26. The second electrically conductive layer 90 may be arranged on a second wall 95 of the first part 26. The second part 27 and the third part 29 partially overlap the first part 26. The second part 27 does not overlap the third part 29. The first electrically conductive layer 30 may be separated from the second electrically conductive layer 90 in the first part 26 of the hole 25. The hole 25 extends in the plane of FIG. 2, i.e. in the plane parallel to the surface 3 of the first dielectric substrate 20, from both sides 50 and 60 of the first electrically conductive layer 30 beyond the first wall 40 and away from the second wall 95. The second part 27 and the third part 29 of the hole 25 extend beyond the first wall 40 away from the second wall 95.

The hole 25 may have a first sidewall 55 and a second sidewall 65. The first sidewall may extend from a first edge 54 of the first sidewall 55 with the first wall 40 away from the first wall 40. The second sidewall 65 may extend from a second edge 64 of the second sidewall 65 with the first wall 40 away from the first wall 40. The first electrically conductive layer 30 may extend from the first edge 54 to the second edge 64. The electrically conductive layer 30 may for example be aligned at both sides 50 and 60 with the first sidewall 55 and the second sidewall 65 of the hole 25, respectively.

The first electrically conductive layer 30 has a first width w1 and the second electrically conductive layer 90 has a second width w2. The second width w2 may be larger than the first width w1. Alternatively, the second width w2 may be substantially equal to the first width w1.

The second conductive layer 90 may extend from the second wall 95 onto a third sidewall 57 and a fourth sidewall 67 of the hole 25. The second conductive layer 90 may extend onto the third sidewall 57 to an interface between the first part 26 and the second part 27. In addition, the second conductive layer 90 may extend onto the fourth sidewall 67 to an interface between the first part 26 and the third part 29.

Figure 3:
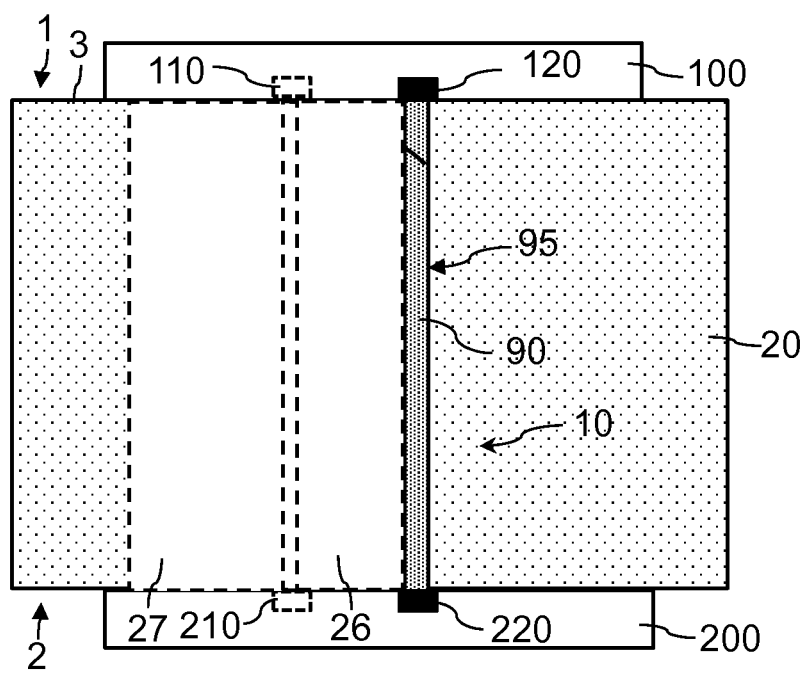
FIG. 3 shows a cross section of the example shown in FIG. 1 and FIG. 2 taken along the line III-III in FIG. 2.

FIG. 3 shows a cross section of the RF coupling structure 10 taken along the line III-III in FIG. 2. FIG. 3 shows the first part 26 and the second part 27 of the hole 25 in the cross-section. The first part 26, the second part 27 and the third part 29 (not shown in FIG. 3) extend through the first dielectric substrate 20 from the first side 1 to the second side 2.

An effect of having the hole 25 extending beyond the first wall 40 away from the second wall 95 will be hereinafter described with reference to FIG. 4.

Figure 4:
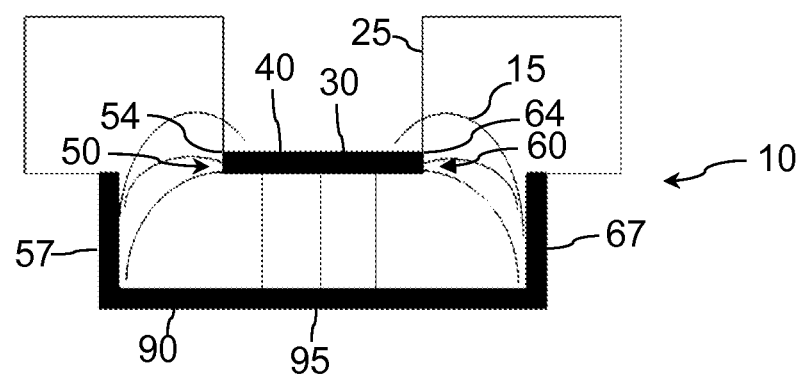
FIG. 4 shows a cross section of the example shown in FIGS. 1-3.

FIG. 4 shows a cross-section of the RF coupling structure 10 similar to the cross-section of FIG. 2. The cross-section shown in FIG. 4 shows the distribution of the electric field (E-field) lines 15 in the RF coupling structure 10. The E-field lines 15 originated from the first electrically conductive layer 30 may be pointing towards the second electrically conductive layer 90. The distribution of the electric field lines 15 may depend upon the frequency of RF signal crossing the RF coupling structure 10, a dielectric constant of the first dielectric substrate 20, thickness of the first dielectric substrate 40 and geometry of the hole 25 (e.g. distance between the first electrically conductive layer 30 and the second electrically conductive layer 90, size of the second part 27 and the third part 29 of the hole 25). The RF coupling structure 10 may behave as a microstrip line wherein the first electrically conductive layer 30 is a top signal conductor and the second electrically conductive layer 90 is a bottom ground conductor. A space inside the hole 25 between the first electrically conductive layer 30 and the second electrically conductive layer 90 may be filled with air so that most of the E-field lines 15 are distributed inside the hole 25 filled with air. Since most of the E-filed lines 15 of the RF coupling structure 10 are distributed in the hole 25, e.g. filled with air, less E-field lines 15 propagate inside the first dielectric substrate 20 from an interface hole-first dielectric substrate 20. E-field lines 15 are bent upwards in proximity of the first edge 54 and the second edge 64 at both sides 50 and 60 of the first electrically conductive layer 30. An extension of the hole 25 beyond the first wall 40 away from the second wall 95 helps to maintain the E-field lines 15 in proximity of both sides 50 and 60 inside the hole 25.

When the second electrically conductive layer 90 extends onto the sidewalls 57 and 67 of the hole 25, E-filed lines 15 in proximity of both sides 50 and 60 may propagate from the first electrically conductive layer 30 directly to the second electrically conductive layer 90 without penetrating the first dielectric substrate 20.

Propagation of the E-field lines from the first electrically conductive layer 30 to the second electrically conductive layer 90 through the first dielectric substrate 20, with e.g. a relatively high dielectric constant, is a narrow-band process. By maintaining most of the E-field lines inside the hole 25, e.g. in the air filling the hole 25, a wideband frequency response of the RF coupling structure 10 may be obtained.

The hole 25 may be filled with any suitable dielectric material different than air. For example, the hole 25 may be filled with a second dielectric material having a second dielectric constant larger or smaller than a first dielectric constant of the first dielectric substrate 20. For example, the first dielectric constant may be in a first range of 1.0 to 5.0 while the second dielectric constant may be in a second range of 1.0 to 12.0. Alternatively, the first dielectric constant may be larger than 5.0 and the second dielectric constant larger than 12.0.

The first dielectric substrate 20 may be any type of suitable dielectric substrate. For example, a low cost printed circuit board dielectric substrate material may be used, such for example FR4 dielectric substrate material, ceramic dielectric substrate material.

The first electrically conductive layer 30 and the second electrically conductive 90 may be arranged parallel to each other as in the examples shown in the FIGS. 1-4. However, the first electrically conductive layer 30 and the second electrically conductive 90 may be arranged not in parallel, e.g. if the hole 25 has a rounded shape.

The hole 25 may have any shape suitable for the specific implementation. For example, as shown in FIG. 2, the hole 25 has substantially a C cross-section, where the longer external side of the C is flat and parallel to the shorter internal side of the C. The first part 26, the second part 27 and the third part 29 of the hole 25 may have any suitable shape. For example, with reference to FIG. 2 the first part 26, the second part 27 and the third part 29 may have a square or rectangular shape. The second part 27 and the third part 29 of the hole 25 may have a suitable shape such that the second part 27 and the third part 29 of the hole 25 extend beyond the first wall 40 away from the second wall 95 by at least two microns. For example, the hole 25 may extend beyond the first wall 40 away from the second wall 95 by at least two microns to 100 millimeters. Size of the first part 26 with respect to the second part 27 and the third part 29, distance of the first electrically conductive layer 30 to the second electrically conductive layer 95 are selected geometrical parameters of the hole 25 which may be chosen by design to suit a particular application. The selected geometrical parameters of the hole 25 depend upon the radio frequency of operation of the RF coupling structure 10 and will be tuned to provide a desired E-field and magnetic field (H-field) distribution pattern in the RF coupling structure 10 to enhance RF losses and improve matching.

For example, referring to FIG. 2, for a radio frequency of operation of 70 GHz to 90 GHz, the second part 27 and the third part 29 of the hole 25 may have substantially an equal area. The first part 26 of the hole 25 may have an area substantially equal to the area of the second part 27 or the third part 29. A distance between the first electrically conductive layer 30 and the second electrically conductive layer 90 may be a few tenth of millimeters or larger, for example in a range between 0.2 to 1 mm. The total area of the hole 25 may be in a range of a few tenth square millimeters or larger, e.g. larger than 0.1 mm$^2$.

Figure 5:
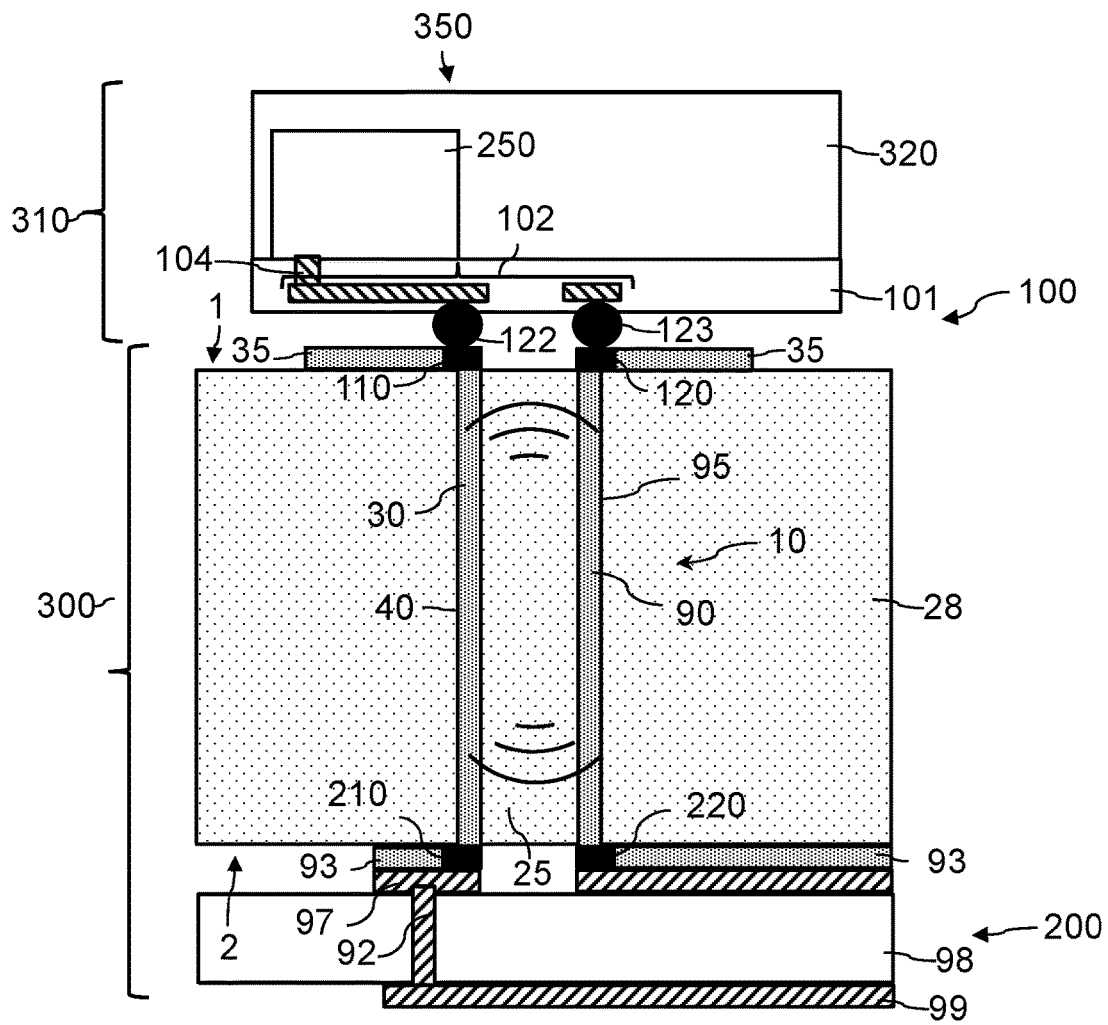
FIG. 5 shows a cross section of a radio frequency device.

FIG. 5 shows a radio frequency device 350. The RF device 350 comprises a printed circuit board (PCB) 300 and an integrated circuit package 310.

The PCB 300 comprises the RF coupling structure 10 as described with reference to FIGS. 1-4.

The PCB 300 may comprise a first board electrically conductive layer 35, a second board electrically conductive layer 93, a third board electrically conductive layer 97, a fourth board electrically conductive layer 99, a first board dielectric substrate 28 and a second board dielectric substrate 98. The first board electrically conductive layer 35 is arranged on first board dielectric substrate 28 which is arranged on the second board electrically conductive layer 93. The second board electrically conductive layer 93 may be arranged on the third board electrically conductive layer 97. The third board electrically conductive layer 97 may be arranged on the second board dielectric substrate 98. The second board dielectric substrate 98 may be arranged on the fourth board electrically conductive layer 99.

The first board dielectric substrate 28 is formed as the first dielectric substrate 20 shown in the FIGS. 1-4. The hole 25 is arranged through the first board dielectric substrate 28 and extends from the first side 1 to the second side 2 of the first board dielectric substrate 28. The RF coupling structure 10 of FIG. 5 is equivalent to the one described with reference to the FIGS. 1-4.

The first board electrically conductive layer 35 comprises the first signal terminal 110 and the first reference terminal 120 of the first radiating element 100. For example, the first board electrically conductive layer 35 may be patterned in a first signal path and in a first reference path. The first signal path may be electrically connected to the first signal terminal 110 while the first reference path may be electrically connected to the first reference terminal 120.

Similarly, the second board electrically conductive layer 93 comprises the second signal terminal 210 and the second reference terminal 220. The second board electrically conductive layer 93 may be patterned in a second signal path and in a second reference path. The second signal path may be electrically connected to the second signal terminal 210 while the second reference path may be electrically connected to the second reference terminal 220.

The PCB 300 comprises the second radiating element 200 which is partly formed in the fourth board electrically conductive layer 99 and contacted to the second signal terminal 210 via a via hole 92 which extends through the second board dielectric substrate 98.

The first radiating element 100 is partially integrated in the RF circuit package 310. The integrated circuit package 310 comprises an integrated circuit die 250. The integrated circuit die 250 may be arranged to generate the RF signal for transmitting the RF signal via the first radiating element 100. Alternatively or additionally, the integrated circuit die 250 may be arranged to receive the RF signal as received via the first radiating element 100.

The integrated circuit die 250 may comprise any circuit suitable for the specific implementation. For example, the circuit integrated die 250 may comprise a circuit of the group of circuits consisting of: a transmitter, a receiver, and a transceiver. The circuit may be electrically coupled to the first radiating element 100.

The integrated circuit package 310 may comprise a package dielectric substrate 101 on which the integrated circuit die 250 is placed, e.g. soldered or mounted on the package dielectric substrate 101. The integrated circuit die 250 may be electrically connected to the radiating element 100 via e.g. a via hole 104 extending through the package dielectric substrate 101 or via solder balls, or otherwise. The integrated circuit die 250 may be encapsulated by for example a plastic moulding compound 320. The first signal terminal 110 may be contacted to the first signal path of the first radiating element 100 via one or more solder-balls 122. The first reference terminal 120 may be contacted to the first reference path of the first radiating element 100 via one or more solder-balls 123.

The first radiating element 100 and the second radiating element 200 may be any type of radiating element suitable for the specific implementation. For example, the first radiating element 100 and the second radiating element 200 may be one of the group of radiating elements comprising: a single-ended microstrip antenna, a differential microstrip antenna, a rectangular patched single-ended antenna, a rectangular patched differential antenna, a square patched single-ended antenna, a square patched differential antenna, a waveguide, and a slotline.

The first radiating element 100 and the second radiating element 200 may be arranged to be planar radiating elements. Alternatively, the first radiating element 100 and the second radiating element 200 may be not planar and e.g. be arranged on multiple layers.

For example, the first radiating element 100 may comprise a co-planar waveguide 102.

Figure 6:
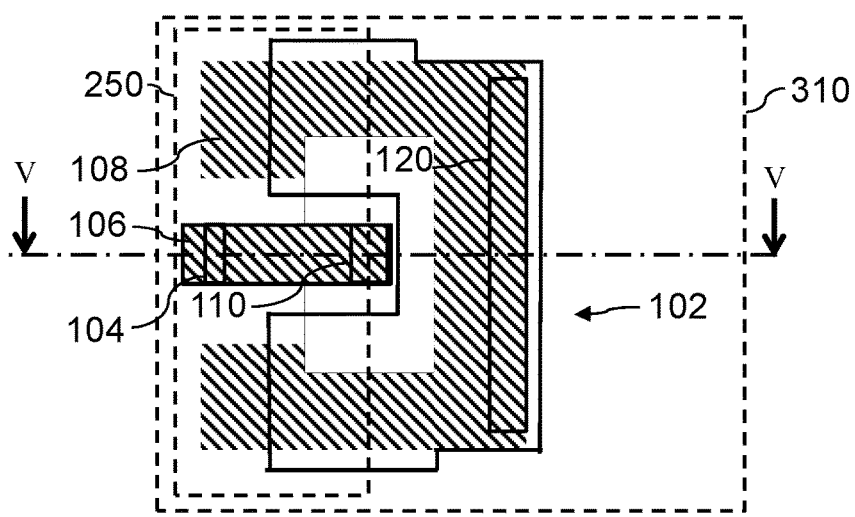
FIG. 6 shows a planar view of an example of an embodiment of a radiating element.

Referring to FIG. 6, the co-planar waveguide 102 comprises a signal path 106 and a return signal path 108. The signal path 106 is electrically connected via the via hole 104 to the integrated circuit die 250 and electrically coupled via the one or more solder balls 122, shown in FIG. 5, to the first signal terminal 110. The return signal path 108 may be connected to the integrated circuit die 250 via one or more electrically conductive vias through the package dielectric substrate 101 shown in FIG. 5 and via the one or more solder balls 123 to the first reference terminal 120. The return signal path 108 may be directly connected to a reference potential, e.g. ground, inside the integrated circuit package 310. Alternatively, the return signal path 108 may connected to the reference potential outside the integrated circuit package 310, e.g. in the PCB 300 via the first board electrically conductive layer 35.

Referring to FIG. 5, the RF device 350 provides a relatively simple transition from the co-planar waveguide 102 integrated in the integrated circuit package 310 to the second radiating element 200. When the RF signal is transferred from the first radiating element 100 to the second radiating element 200 via the RF coupling structure 10, the RF signal may undergo several electromagnetic conversion modes. For example, if the second radiating element 200 comprises a microstrip line formed in the fourth electrically conductive layer 99, the transition is from the co-planar waveguide 102 to the microstrip line via the RF coupling structure 10. In this example, the RF signal undergoes from a co-planar waveguide electromagnetic mode to a microstrip line electromagnetic mode of the RF coupling structure 10 to another microstrip line electromagnetic mode. Such electromagnetic mode of a microstrip line is known in the art as a quasi-transverse-electromagnetic mode (quasi-TEM mode). The electromagnetic mode of a co-planar waveguide is similar to the electromagnetic mode of a mircrostrip line, i.e. also a quasi-TEM. As a consequence, the RF device 350 may provide an electromagnetic conversion from a quasi-TEM mode of the co-planar waveguide 102 via a quasi-TEM mode of the RF coupling structure 10 to a quasi-TEM mode of the microstrip line formed in the fourth electrically conductive layer 99. Since the electromagnetic modes in the conversion are of the same types, mismatch losses in the RF device 350 in the transition may be reduced so that insertion losses of the transition can be reduced. Insertion losses of the transition in the example described above are reduced compared to for example a transition in which the RF coupling structure 10 is replaced by a waveguide, as for example in the above mentioned U.S. Pat. No. 8,169,060 B2.

Figure 7:
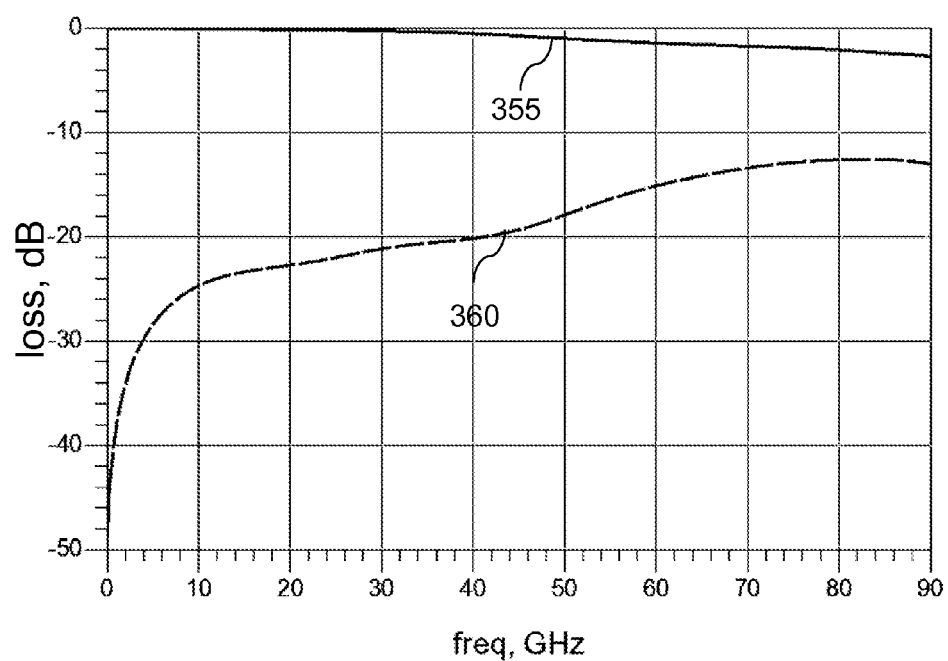
FIG. 7 graphically shows the simulated scattering parameters for the example shown in FIGS. 5 and 6.

FIG. 7 shows a graph schematically indicating the simulated scattering parameters (S-parameters) characteristics for the transition described in the example above of a co-planar waveguide 102 to RF coupling structure 102 to microstrip line. The graph shows simulated insertion loss 355 between an input terminal at the integrated circuit die 250 side of the co-planar waveguide 102 and an output terminal of the microstrip line (not shown) formed in the fourth board electrically conductive layer 99. The graph further shows simulated return loss 360 at the input terminal. The graph shows that the insertion loss 355 of the transition is within −3 dB in a frequency range of 0 to 90 GHz while the return loss 360 is maintained below −10 dB in the same frequency range.

The RF coupling structures 10 and RF devices 350 may be used in RF communications systems of one of the group of RF communications system comprising: a wireless LAN, an E-band backhaul, a radar system. For example, the RF devices 350 may be a radar sensor working at any frequency range suitable for the specific radar system. For example, in a short detection range radar system, e.g. within 5 to 10 meters detection range, the radar sensors may be working at a frequency range of 24-25 GHz, for an intermediate and long detection range radar system, e.g. within 100 meters detection range and beyond, the radar sensors may be working at a frequency range of 76-81 GHz.

Figure 8:
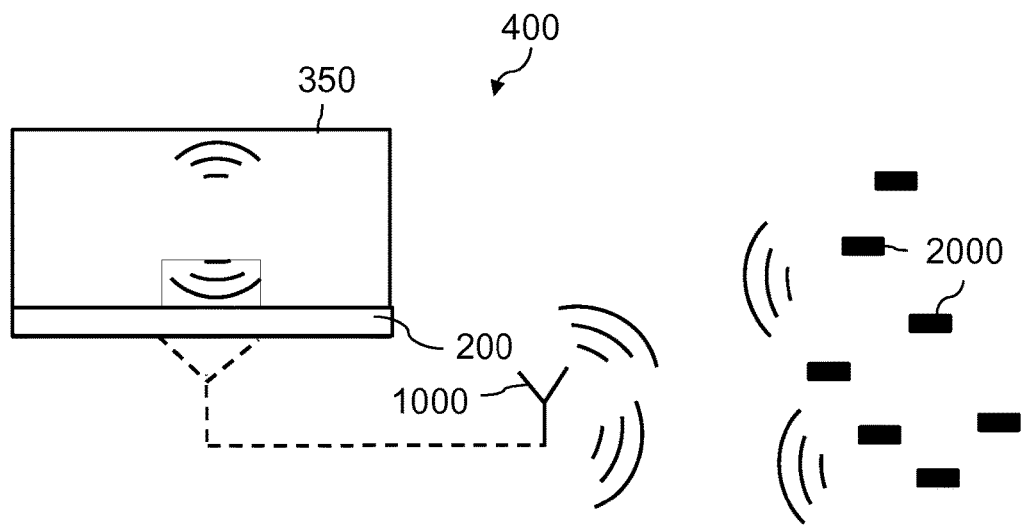
FIG. 8 schematically shows an example of a radar sensor.

FIG. 8 schematically shows an example of a radar sensor 400. The radar sensor 400 comprises the RF device 350 as described in the example shown in FIG. 5, and an antenna 1000. The antenna 1000 may be electrically coupled to second radiating element 200, e.g. via a coaxial cable, an RF connector soldered or screwed in the printed circuit board 310 (not shown in FIG. 8). The antenna 1000 may be electrically coupled to the second radiating element 200 to transmit and/or receive the RF signal through a frequency channel. The radar sensor 400 may be used to detect a set of targets 2000 in a field of view of e.g. an automotive vehicle within a predetermined detection range. The RF signal may be transmitted from a transceiver in the RF device 350 via the RF coupling structure 10, and via the antenna 1000 to the targets 2000. The RF signal may be reflected back from the set of targets 2000 to the antenna 1000. A circuit, e.g. of the integrated circuit die 250 shown in FIG. 5 may receive the RF signal reflected back from the set of targets 2000.

Figure 9:
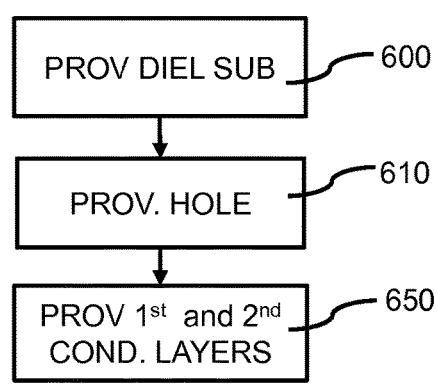
FIG. 9 schematically shows a flow diagram of an example of a method of manufacturing a radio frequency coupling structure.

FIG. 9 shows a flow diagram of a method of manufacturing a radio frequency coupling structure as described with reference to the FIGS. 1-4.

The method comprises: providing 600 a first dielectric substrate, providing 610 an hole extending through the first dielectric substrate from a first side of the first dielectric substrate to a second side of the first dielectric substrate. The first side is opposite to the second side. The method further comprises providing 650 a first electrically conductive layer and a second electrically conductive layer.

The first electrically conductive layer is arranged on a first wall of the hole. The second electrically conductive layer is arranged on a second wall of the hole opposite to the first wall. The first electrically conductive layer is separated from the second electrically conductive layer. The hole extends beyond the first wall away from the second wall.

The method will be hereinafter described with reference to three different examples. A first example is hereinafter described with reference to the flow diagram shown in FIG. 10 and through the FIGS. 13A-13E. FIGS. 13A-13E show planar views of intermediate structures 5 to 9 obtained in a first example of a method of manufacturing the RF coupling structure 10.

Figure 13A:
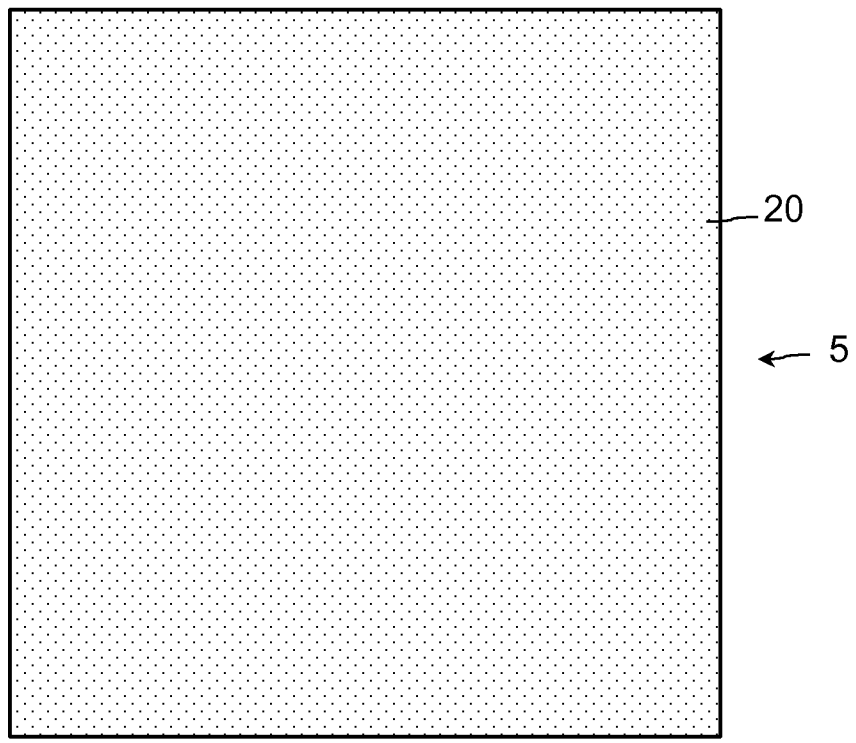
FIG. 13A-13E show planar views of intermediate structures obtained in a first example of a method of manufacturing a radio frequency coupling structure.

FIG. 13A shows a planar view of a first intermediate structure 5 comprising the first dielectric substrate 20.

Figure 13B:
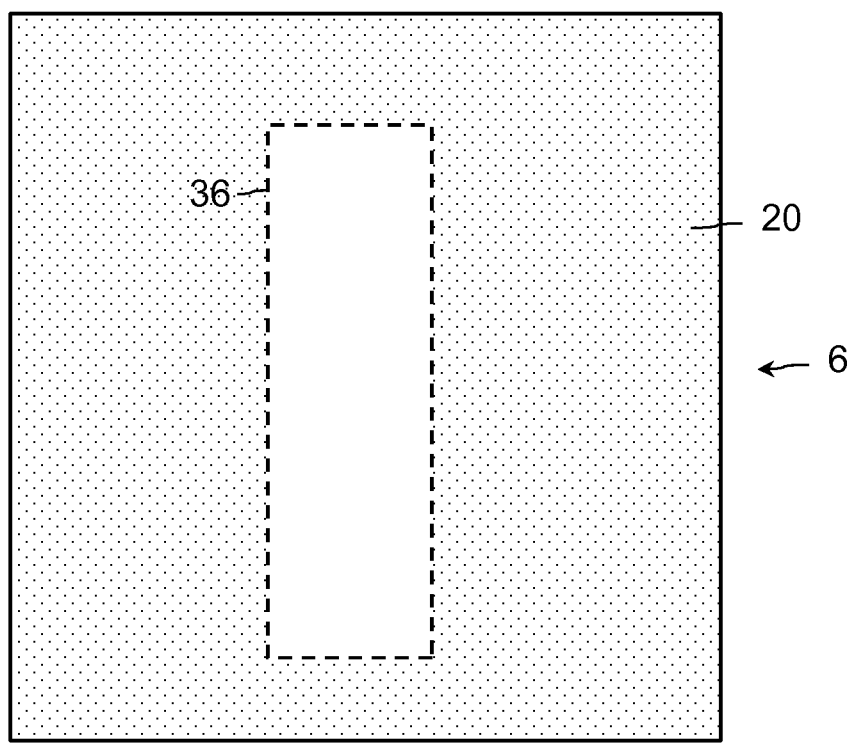

FIG. 13B shows a planar view of a second intermediate structure 6 obtained after providing 600 the first dielectric substrate 20. After providing 600 the first dielectric substrate 20, a first hole 36 is provided, e.g. drilled though the first dielectric substrate 20. The first hole 36 extends through the first dielectric substrate 20 from the first side to the second side (not shown in the planar view of FIG. 13B).

Figure 13C:
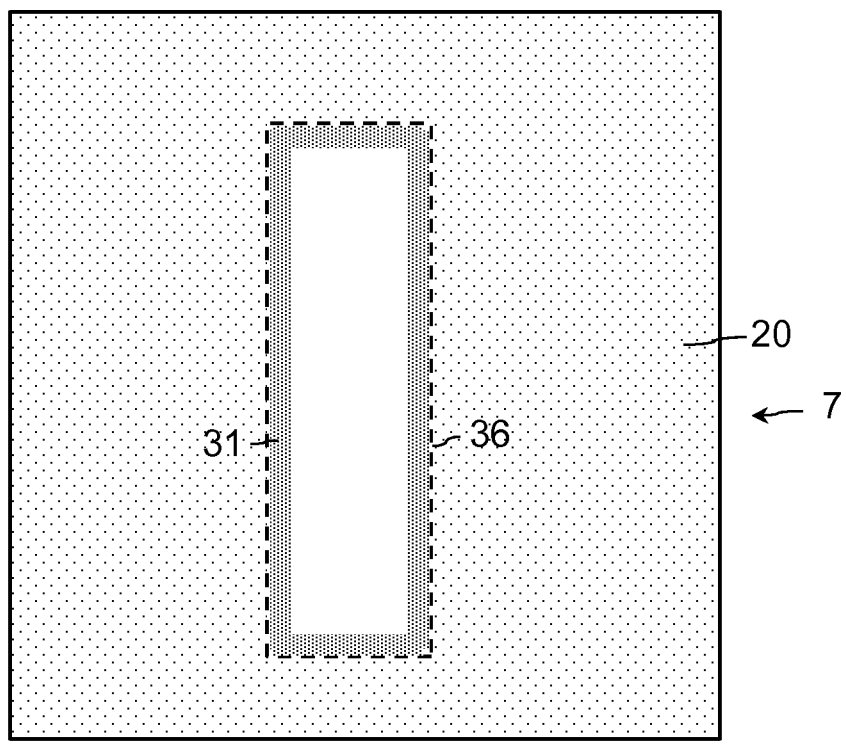

FIG. 13C shows a planar view of a third intermediate structure 7 obtained after plating 613 the first hole 36 with an electrically conductive layer 31. Sidewalls of the first hole 36 are covered with the electrically conductive layer 31.

Figure 13D:
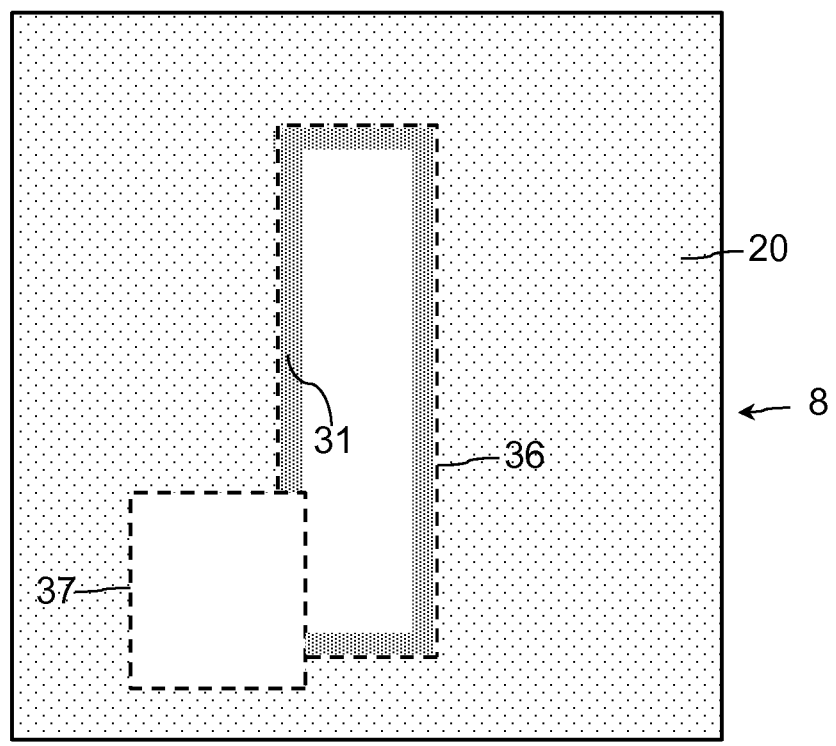

FIG. 13D shows a planar view of a fourth intermediate structure 8 obtained after providing 614 the first dielectric substrate 20 with a second hole 37 partially overlapping the first hole 36. The second hole 37 extends through the first dielectric substrate 20 from the first side to the second side.

Figure 13E:
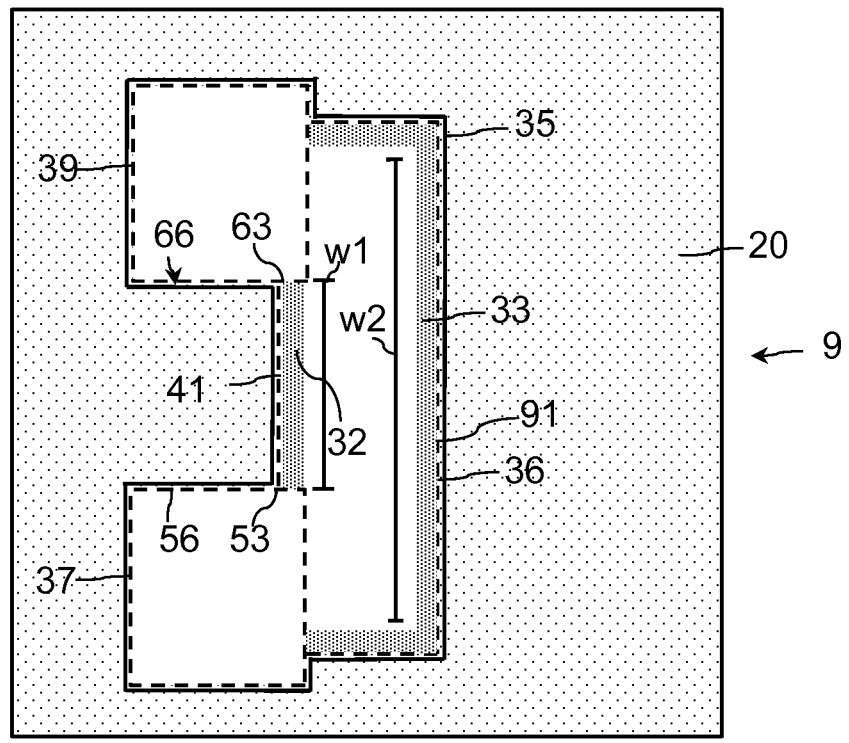

FIG. 13E shows a planar view of the complete RF coupling structure 9 after providing 616 the first dielectric substrate 20 with a third hole 39. The third hole 39 partially overlaps the first hole 36. The third hole 39 extends through the first dielectric substrate 20 from the first side to the second side.

According to this first example, referring to the flow diagram shown in FIG. 10, providing 610 the hole 35 comprises providing 602 the first dielectric substrate 20 with the first hole 36, providing 614 the first dielectric substrate 20 with the second hole 37 and providing 616 the first dielectric substrate 20 with the third hole 39. The first hole 36, the second hole 36 and the third hole 39 form the hole 36 e.g. with a desired shape.

Providing 614 the first dielectric substrate 20 with the second hole 37 after plating 613 the first hole 36 cuts away a layer part of the electrically conductive layer 31.

Providing 616 the first dielectric substrate 20 with the third hole 39 after plating 613 the first hole 36 and after e.g. providing 614 the first dielectric substrate 20 with the second hole 37, cuts away a further layer part of the electrically conductive layer 31.

Eventually, after cutting away a layer part with the second hole 37 and after cutting away a further layer part with the third hole 39, the first electrically conductive layer 32 and the second electrically conductive layer 33 are formed, with the first electrically conductive layer 32 separated from the second electrically conductive layer 33.

The first hole 36 corresponds to the first part 26 of the hole 25 shown in FIG. 2. The second hole 37 corresponds to the second part 27 of the hole 25 shown in FIG. 2. The third hole 39 corresponds to the third part 29 of the hole 25 shown in FIG. 2. The first electrically conductive layer 32 of FIG. 13E corresponds to the first electrically conductive layer 30 shown in FIG. 2. The second electrically conductive layer 33 of FIG. 13E corresponds to the second electrically conductive layer 90 shown in FIG. 2.

A second example of a method of manufacturing a radio frequency coupling structure is described with reference to the FIGS. 14A-14Ca and to the flow diagram of FIG. 11.

Figure 14A:
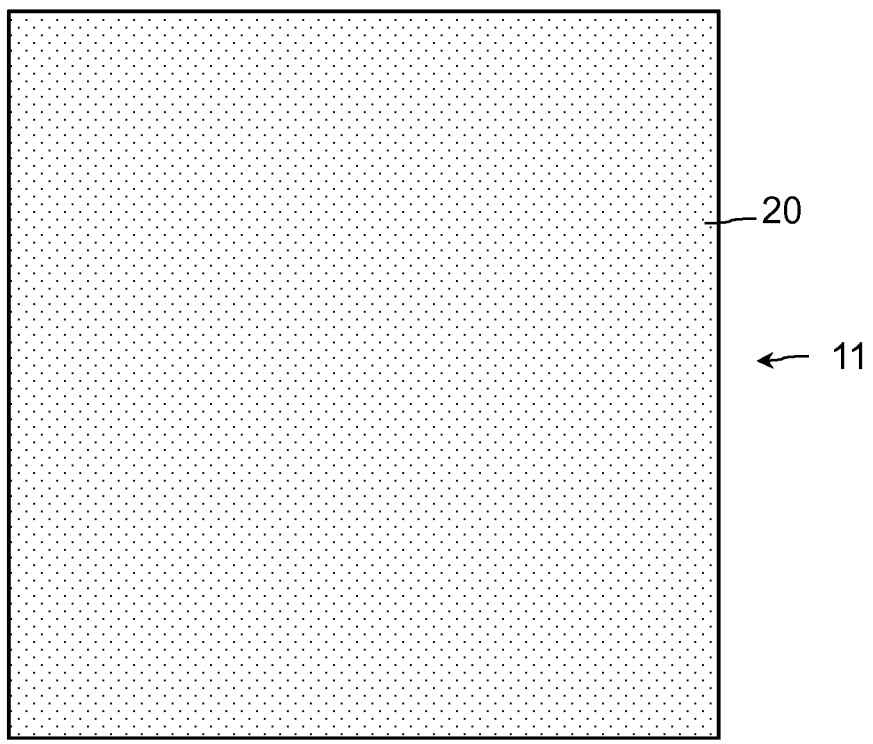
FIG. 14A-14F show planar views of intermediate structures obtained in a second example of a method of manufacturing a radio frequency coupling structure.

FIG. 14A shows a planar view of a first intermediate structure 11 comprising the first dielectric substrate 20.

Figure 14B:
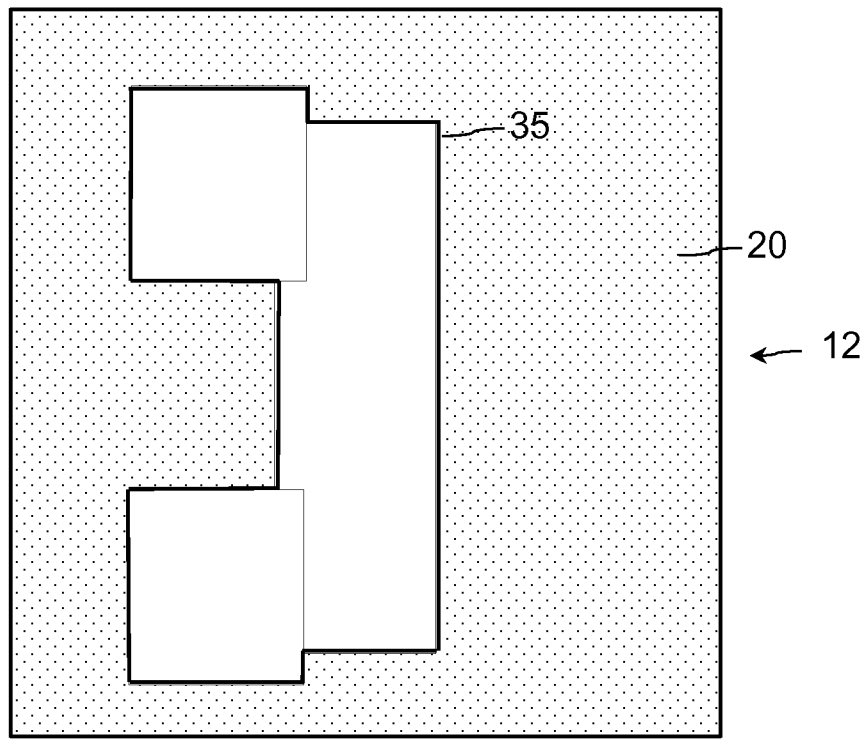

FIG. 14B shows a planar view of a second intermediate structure 12. The second intermediate structure 12 comprises the hole 35. The hole 35 is provided through the first dielectric layer 20. The second intermediate structure 12 may for example be obtained as described with reference to the FIGS. 13D-13E, e.g. by drilling a first hole, a second hole and a third hole. Alternatively, the second intermediate structure 12 may be obtained by directly drilling the hole 35, e.g. by using a drilling tip with a desired shape.

Figure 14C:
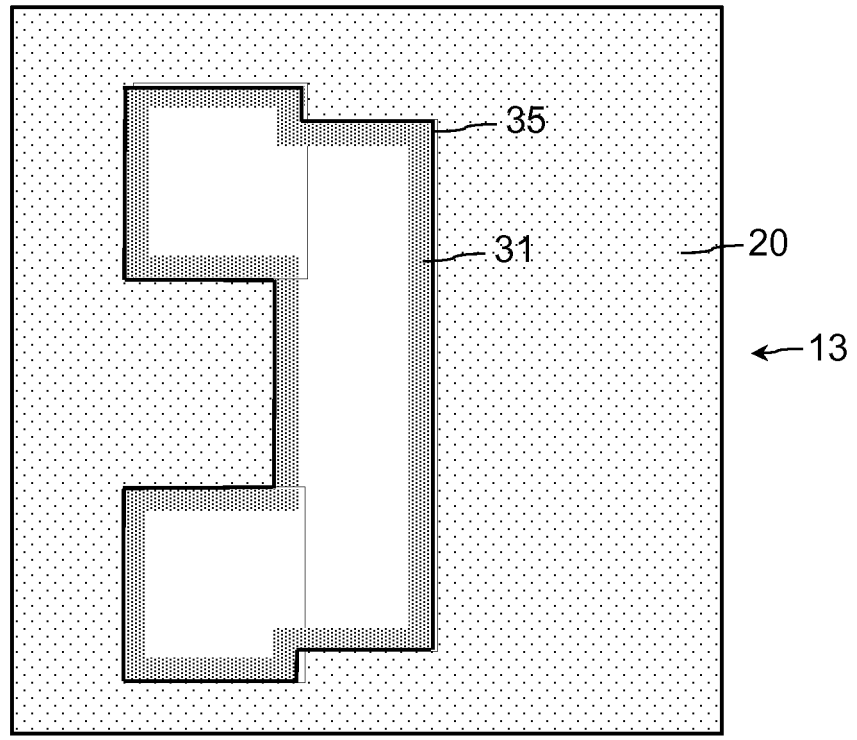

After providing 610 the hole 35, the hole 35 may be plated 620 with an electrically conductive layer 31 as shown in the planar view of a third intermediate structure 13 of FIG. 14C. Sidewalls of the hole 35 are covered with the electrically conductive layer 31.

Figure 14D:
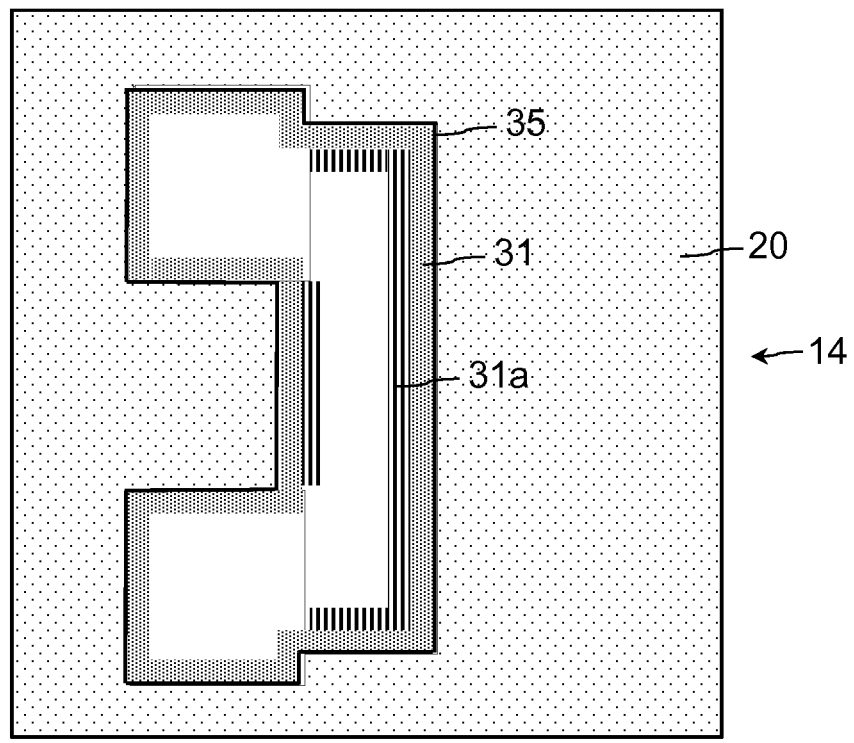

With reference to the intermediate structure 14 of FIG. 14D, after plating 620 the hole 35 with the electrically conductive layer 31, a photo-resist layer 31a may e.g. be deposited 652 on a first part and a second part of the electrically conductive layer 31. Depositing 652 the photo-resist layer may be selectively performed along desired walls or desired parts of the walls of the hole 25 by for example paint-like tools. The first part corresponds to the first electrically conductive layer. The second part corresponds to the second electrically conductive layer. The photo-resist layer 31a may protect the first and second parts from subsequent etching.

Figure 14E:
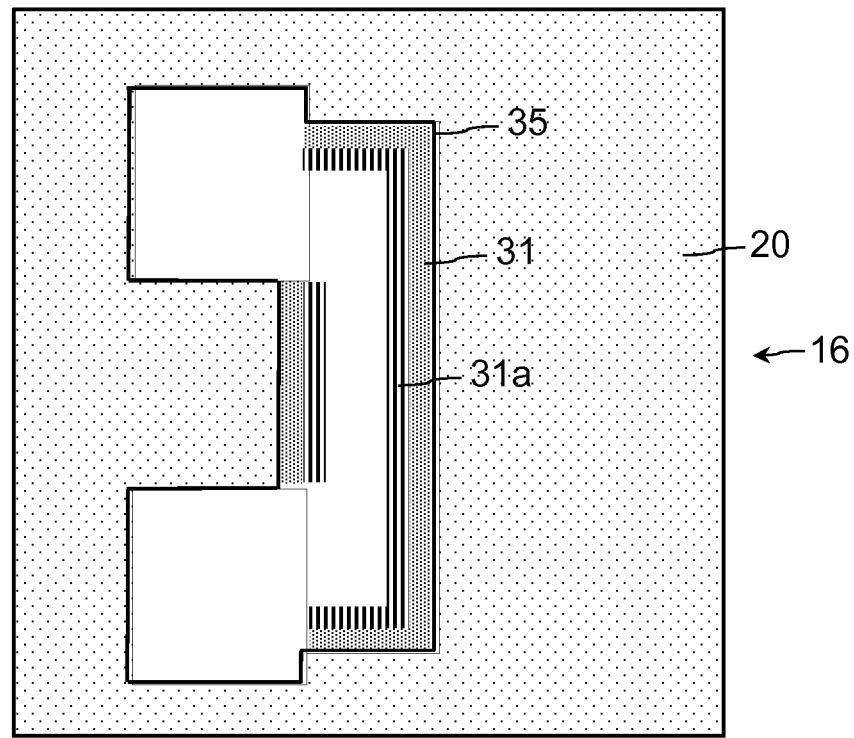

With reference to the intermediate structure 16 of FIG. 14E, parts of the electrically conductive layer 31 non covered by the photo-resist layer may be etched 654 away in an etch process such that the first part and the second part of the electrically conductive layer 31 are maintained.

Figure 14F:
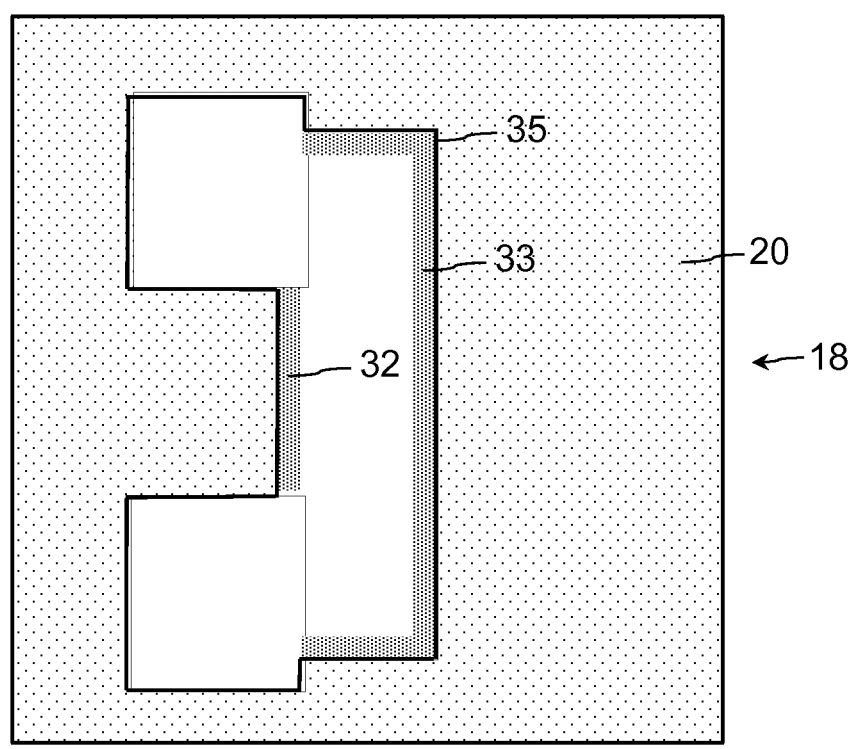

With reference to the intermediate structure 18 of FIG. 14F, equivalent to that of FIG. 13E, the photo-resist layer 31a may be removed 656 to leave unexposed the first part and the second part of the electrically conductive layer 31.

Referring to the flow diagram shown in FIG. 12 of a third example of a method of manufacturing a RF coupling structure, providing 650 the first electrically conductive layer 32 may comprise placing 660 one or more first metal staples in the hole 35 to form the first electrically conductive layer 32. Similarly providing 650 the second electrically conductive layer 33 may comprise placing 662 one or more first metal staples in the hole 35 to form the second electrically conductive layer 33. In this third example, the first and the second electrically conductive layers 32 and 33 may be provided directly after the hole 35 is formed without additional metal plating and/or metal etching processes, or in combination therewith.

Providing 610 the first dielectric substrate 20 with the hole 35 may comprise providing the hole 35 with a first sidewall 56 extending from a first edge 53 of the first sidewall 56 with the first wall 41 away from the first wall 41.

Providing 610 the first dielectric substrate 20 with the hole 35 may comprise providing the hole 35 with a second sidewall 66 extending from a second edge 63 of the second sidewall 66 with the first wall 41 away from the first wall 41.

The first electrically conductive layer 32 may for example extend between the first edge 53 and the second edge 63.

Further, after providing 650 the first and the second electrically conductive layers 32 and 33, additional holes may be provided, e.g. drilled through the first dielectric substrate 20, to cut further the second electrically conductive layer 33 such that the second width w2 of the second electrically conductive 33 is reduced. For example, the second electrically conductive layer 33 may be cut such that the second width w2 is larger than the first width w1 of the first electrically conductive layer 32. Alternatively, the further holes may be provided to cut the second electrically conductive layer 33 such that the second with w2 is substantially equal to the first width w1.

In the foregoing specification, the invention has been described with reference to specific examples of embodiments of the invention. It will, however, be evident that various modifications and changes may be made therein without departing from the scope of the invention as set forth in the appended claims. For example, the electrical connections may be any type of electrical connection suitable to transfer signals from or to the respective nodes, units or devices, for example via intermediate devices. Accordingly, unless implied or stated otherwise the connections may for example be direct connections or indirect connections.

Also, devices functionally forming separate devices may be integrated in a single physical device. For example, as shown through FIG. 5, a single integrated circuit die 250 may integrate a transmitter and a receiver. However, the transmitter and the receiver may be integrated in separate integrated circuit dies both electrically coupled to the first radiating element 100.

Although the invention has been described with respect to specific conductivity types or polarity of potentials, skilled artisans appreciated that conductivity types and polarities of potentials may be reversed. For example in the FIG. 4 the electric field lines have been schematically shown without a specific orientation. However, since the RF signal is a time-dependent signal and varies periodically its sign, the electric field lines may be oriented in a direction going from the first electrically conductive layer 30 to the second electrically conductive layer 90 or in an opposite direction going from the second electrically conductive layer 90 to the first electrically conductive layer 30.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A radio frequency coupling structure for coupling a radio frequency signal between a first radiating element arranged at a first side of a first dielectric substrate and a second radiating element arranged at a second side of the first dielectric substrate, the second side being opposite to the first side, the radio frequency coupling structure comprising:
   a hole arranged through the first dielectric substrate extending from the first side to the second side, the hole having a non-elliptical shape in cross section, the hole including a first part, a second part, and a third part, wherein the first part includes a first wall and a second wall, the second wall being spaced apart from and facing the first wall, the second part of the hole intersects with the first part proximate a first end of the first wall, the third part of the hole intersects with the first part of the hole proximate a second end of the first wall such that the first and second parts are spaced apart from one another by the first wall, and the first and second parts extend in a lateral direction beyond the first wall and away from the second wall;
   a first electrically conductive layer arranged on the first wall of the hole for electrically connecting a first signal terminal of the first radiating element to a second signal terminal of the second radiating element;
   a second electrically conductive layer arranged on the second wall of the hole for electrically connecting a first reference terminal of the first radiating element to a second reference terminal of the second radiating element,
   the first electrically conductive layer being separated from the second electrically conductive layer in the first part of the hole.

2. A radio frequency coupling structure as claimed in claim 1, wherein:
   the second part of the hole includes a first sidewall having a first edge that intersects with the first end of the first wall; and
   the third part of the hole includes a second sidewall having a second edge that intersects with the second end of the first wall, the first and second sidewalls extending away from the first and second walls of the first part of the hole.

3. A radio frequency coupling structure as claimed in claim 2, the first electrically conductive layer extending from the first edge to the second edge.

4. A radio frequency coupling structure as claimed in claim 3, the first electrically conductive layer having a first width extending from the first edge to the second edge, the second electrically conductive layer having a second width aligned with the first width that is larger than the first width.

5. A radio frequency coupling structure as claimed in claim 1, wherein the first part of the hole has a third sidewall and a fourth sidewall facing the third sidewall, the third and fourth sidewalls being spaced apart from one another by the second wall of the first part of the hole, and the second electrically conductive layer extends from the second wall onto each of the third and fourth sidewalls of the first part of the hole.

6. A radio frequency coupling structure as claimed in claim 1, wherein the second and third parts of the hole extend laterally beyond the first wall of the first part of the hole by at least two microns.

7. A radio frequency coupling structure as claimed in claim 1, the first dielectric substrate having a first dielectric constant, the hole being filled with a dielectric material having a second dielectric constant substantially smaller than the first dielectric constant.

8. A printed circuit board comprising the radio frequency coupling structure according to claim 1, the printed circuit board comprising:
   a first board electrically conductive layer,
   a first board dielectric substrate,
   a second board electrically conductive layer,
   the first board electrically conductive layer being arranged on the first board dielectric substrate, the first board dielectric substrate being arranged on the second board electrically conductive layer,
   the first board dielectric substrate comprising the first dielectric substrate,
   the first board electrically conductive layer comprising the first signal terminal and the first reference terminal of the first radiating element,
   the second board electrically conductive layer comprising the second signal terminal and the second reference terminal of the second radiating element.

9. A printed circuit board as claimed in claim 8, wherein the first radiating element is formed in an integrated circuit package coupled to the first board electrically conductive layer and is electrically coupled with the first signal terminal and the first reference terminal and/or the second radiating element is formed in a separate electrically conductive layer vertically displaced from the second board electrically conductive layer and is electrically coupled with the second signal terminal and the second reference terminal.

10. A printed circuit board as claimed in claim 8, further comprising:
   a third board electrically conductive layer,
   a second board dielectric substrate, and
   a fourth board electrically conductive layer,
   the second board electrically conductive layer being arranged on the third board electrically conductive layer, the third board electrically conductive layer being arranged on the second board dielectric substrate, the second board dielectric substrate being arranged on the fourth board electrically conductive layer, the second radiating element being partially formed on the fourth board electrically conductive layer, wherein the second signal terminal of the second board electrically conductive layer is in electrical contact with the second radiating element by way of an electrically conductive via hole extending through the second board dielectric substrate.

11. A printed circuit board as claimed in claim 8, the first radiating element and/or the second radiating element being one of the group comprising: a single-ended microstrip antenna, a differential microstrip antenna, a rectangular patched single-ended antenna, a rectangular patched differential antenna, a square patched single-ended antenna, a square patched differential antenna, a co-planar waveguide, a slotline.

12. A printed circuit board as claimed in claim 8, the first reference terminal and/or the second reference terminal being electrically connected to a reference potential.

13. A radio frequency device comprising the radio frequency coupling structure as claimed in claim 1, the radio frequency device further comprising:
an integrated circuit package arranged at the first side of the first dielectric substrate, the integrated circuit package comprising an integrated circuit die,
the integrated circuit die being electrically connected to the first radiating element and arranged for generating the radio frequency signal for transmission via the first radiating element and/or for receiving the radio frequency signal as received via the first radiating element.

14. A radio frequency device as claimed in claim 13, the integrated circuit die comprising a circuit of the group of circuits consisting of: a transmitter, a receiver, and a transceiver, the circuit being electrically coupled to the first radiating element.

15. A radar sensor for detecting targets in a field of view comprising the printed circuit board according to claim 7, the radar sensor further comprising:
an antenna electrically coupled to the second radiating element for transmitting and/or receiving the radio frequency signal through a frequency channel.

16. A method of manufacturing a radio frequency coupling structure, comprising:
providing a first dielectric substrate,
providing a hole extending through the first dielectric substrate from a first side of the first dielectric substrate to a second side of the first dielectric substrate, the first side being opposite to the second side, the hole having a non-elliptical shape in cross section, the hole including a first part, a second part, and a third part, wherein the first part includes a first wall and a second wall, the second wall being spaced apart from and facing the first wall, the second part of the hole intersects with the first part proximate a first end of the first wall, the third part of the hole intersects with the first part of the hole proximate a second end of the first wall such that the first and second parts are spaced apart from one another by the first wall, and the first and second parts extend in a lateral direction beyond the first wall and away from the second wall,
providing a first electrically conductive layer and a second electrically conductive layer,
the first electrically conductive layer arranged on the first wall of the hole, the second electrically conductive layer arranged on the second wall of the hole opposite to the first wall, the first electrically conductive layer being separated from the second electrically conductive layer in the first part of the hole.

17. A method of manufacturing a radio frequency coupling structure according to claim 16, the providing the hole comprising:
providing the first dielectric substrate with a first hole corresponding to the first part of the hole,
providing the first dielectric substrate with a second hole corresponding to the second part of the hole extending through the first dielectric substrate from the first side of the first dielectric substrate to the second side of the first dielectric substrate, the second hole partially overlapping the first hole,
providing the first dielectric substrate with a third hole corresponding to the third part of the hole extending through the first dielectric substrate from the first side of the first dielectric substrate to the second side of the first dielectric substrate, the third hole partially overlapping the first hole;
the providing a first electrically conductive layer and a second electrically conductive layer comprising:
plating the first hole with an electrically conductive layer such that the providing the first dielectric substrate with the second hole after plating the first hole cuts away a layer part of the electrically conductive layer, and the providing the first dielectric substrate with the third hole after plating further cuts away a further layer part of the electrically conductive material, to form the first electrically conductive layer and the second electrically conductive layer.

18. A method of manufacturing a radio frequency coupling structure according to claim 16, the method comprising after providing the hole:
plating the hole with an electrically conductive layer,
the providing a first electrically conductive layer and a second electrically conductive layer comprising:
depositing a photo-resist layer on a first part of the electrically conductive layer corresponding to the first electrically conductive layer and on a second part of the electrically conductive layer corresponding to the second electrically conductive layer, to form non-covered parts of the electrically conductive layer,
etching the non-covered parts of the electrically conductive layer to maintain the first electrically conductive layer and the second electrically conductive layer,
removing the photo-resist layer.

19. A method of manufacturing a radio frequency coupling structure according to claim 16, the providing a first electrically conductive layer and a second electrically conductive layer comprising:
placing first metal in the hole to form the first electrically conductive layer and placing second metal in the hole to form the second electrically conductive layer, the placing occurring after providing the first, second, and third holes.

20. A method according to claim 16, further comprising:
providing the first dielectric substrate with the second and third holes to cut away a part of the second electrically conductive layer such that a second width part of the second electrically conductive layer is reduced.

* * * * *